United States Patent
Lin et al.

(10) Patent No.: US 11,335,777 B2
(45) Date of Patent: May 17, 2022

(54) INTEGRATED CIRCUIT COMPONENTS WITH SUBSTRATE CAVITIES

(71) Applicant: Intel Corporation, Santa Clara, CA (US)

(72) Inventors: Kevin L. Lin, Beaverton, OR (US); Paul B. Fischer, Portland, OR (US); Han Wui Then, Portland, OR (US); Sansaptak Dasgupta, Hillsboro, OR (US); Marko Radosavljevic, Portland, OR (US); Ibrahim Ban, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 16/629,551

(22) PCT Filed: Aug. 9, 2017

(86) PCT No.: PCT/US2017/046009
§ 371 (c)(1),
(2) Date: Jan. 8, 2020

(87) PCT Pub. No.: WO2019/032100
PCT Pub. Date: Feb. 14, 2019

(65) Prior Publication Data
US 2020/0144369 A1 May 7, 2020

(51) Int. Cl.
*H01L 29/10* (2006.01)
*H01L 21/764* (2006.01)
(Continued)

(52) U.S. Cl.
CPC ...... *H01L 29/1079* (2013.01); *H01L 21/3065* (2013.01); *H01L 21/764* (2013.01);
(Continued)

(58) Field of Classification Search
CPC ............. H01L 29/1079; H01L 21/3065; H01L 23/5227; H01L 23/528; H01L 27/1203; H01L 29/2003; H01L 29/42376
(Continued)

(56) References Cited

U.S. PATENT DOCUMENTS

| 6,784,519 B2 | 8/2004 | Iwamoto et al. |
| 7,056,801 B2 | 6/2006 | Park et al. |

(Continued)

FOREIGN PATENT DOCUMENTS

| JP | 2002299462 A | 10/2002 |
| KR | 1020050067820 A | 7/2005 |

(Continued)

OTHER PUBLICATIONS

PCT Feb. 26, 2018—International Search Report and Written Opinion of the International Searching Authority from International Application No. PCT/US2017/046009; 12 pages.

*Primary Examiner* — Thinh T Nguyen
(74) *Attorney, Agent, or Firm* — Patent Capital Group

(57) ABSTRACT

Disclosed herein are integrated circuit (IC) components with substrate cavities, as well as related techniques and assemblies. In some embodiments, an IC component may include a substrate, a device layer on the substrate, a plurality of interconnect layers on the device layer, and a cavity in the substrate.

22 Claims, 9 Drawing Sheets

(51) Int. Cl.
*H01L 27/12* (2006.01)
*H01L 21/3065* (2006.01)
*H01L 21/762* (2006.01)
*H01L 21/84* (2006.01)
*H01L 23/522* (2006.01)
*H01L 23/528* (2006.01)
*H01L 29/20* (2006.01)
*H01L 29/205* (2006.01)
*H01L 29/423* (2006.01)
*H01L 29/778* (2006.01)

(52) U.S. Cl.
CPC ........ *H01L 21/76289* (2013.01); *H01L 21/84* (2013.01); *H01L 23/528* (2013.01); *H01L 23/5227* (2013.01); *H01L 27/1203* (2013.01); *H01L 29/2003* (2013.01); *H01L 29/205* (2013.01); *H01L 29/42376* (2013.01); *H01L 29/7786* (2013.01)

(58) Field of Classification Search
USPC .................... 257/76, 347; 438/149, 479, 517
See application file for complete search history.

(56) References Cited

U.S. PATENT DOCUMENTS

| | | | |
|---|---|---|---|
| 8,183,633 | B2 | 5/2012 | Kwon et al. |
| 10,290,614 | B2 | 5/2019 | Then et al. |
| 2007/0274058 | A1* | 11/2007 | Cousin ............... H01L 25/162 |
| | | | 361/760 |
| 2009/0212416 | A1 | 8/2009 | Skeete |
| 2010/0035403 | A1* | 2/2010 | Brown et al. .......... H01L 27/12 |
| | | | 438/422 |
| 2016/0093523 | A1* | 3/2016 | Jaffe et al. ............ H01L 21/764 |
| | | | 438/422 |
| 2018/0083098 | A1* | 3/2018 | Gortepeli ........... H01L 29/0649 |

FOREIGN PATENT DOCUMENTS

| | | |
|---|---|---|
| KR | 1020090064929 A | 6/2009 |
| KR | 1020120040591 A | 4/2012 |
| WO | 2019032100 A1 | 2/2019 |

\* cited by examiner

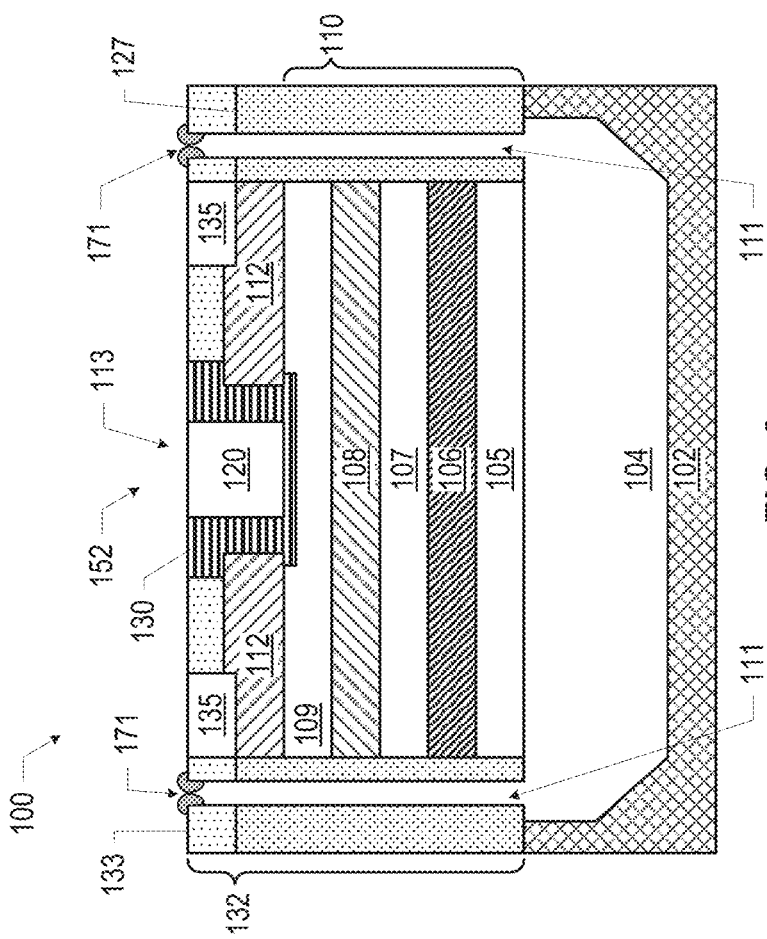
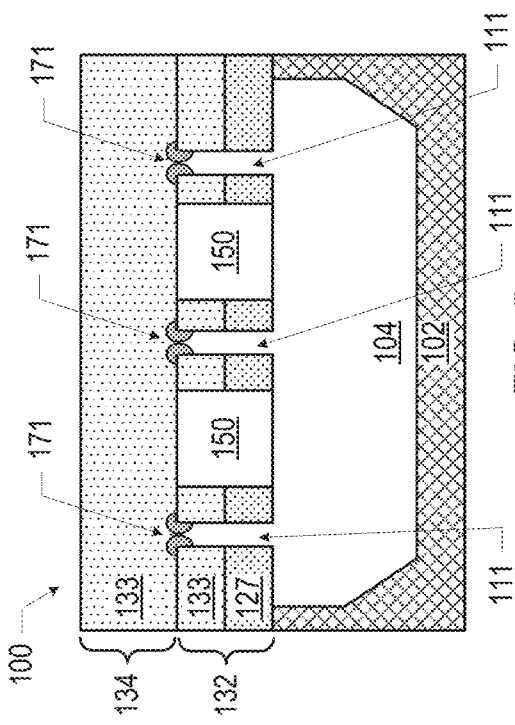
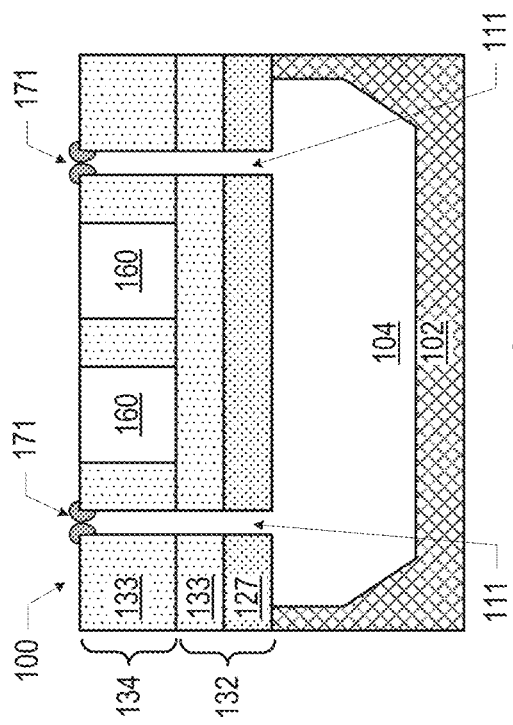
FIG. 8
FIG. 5
FIG. 6

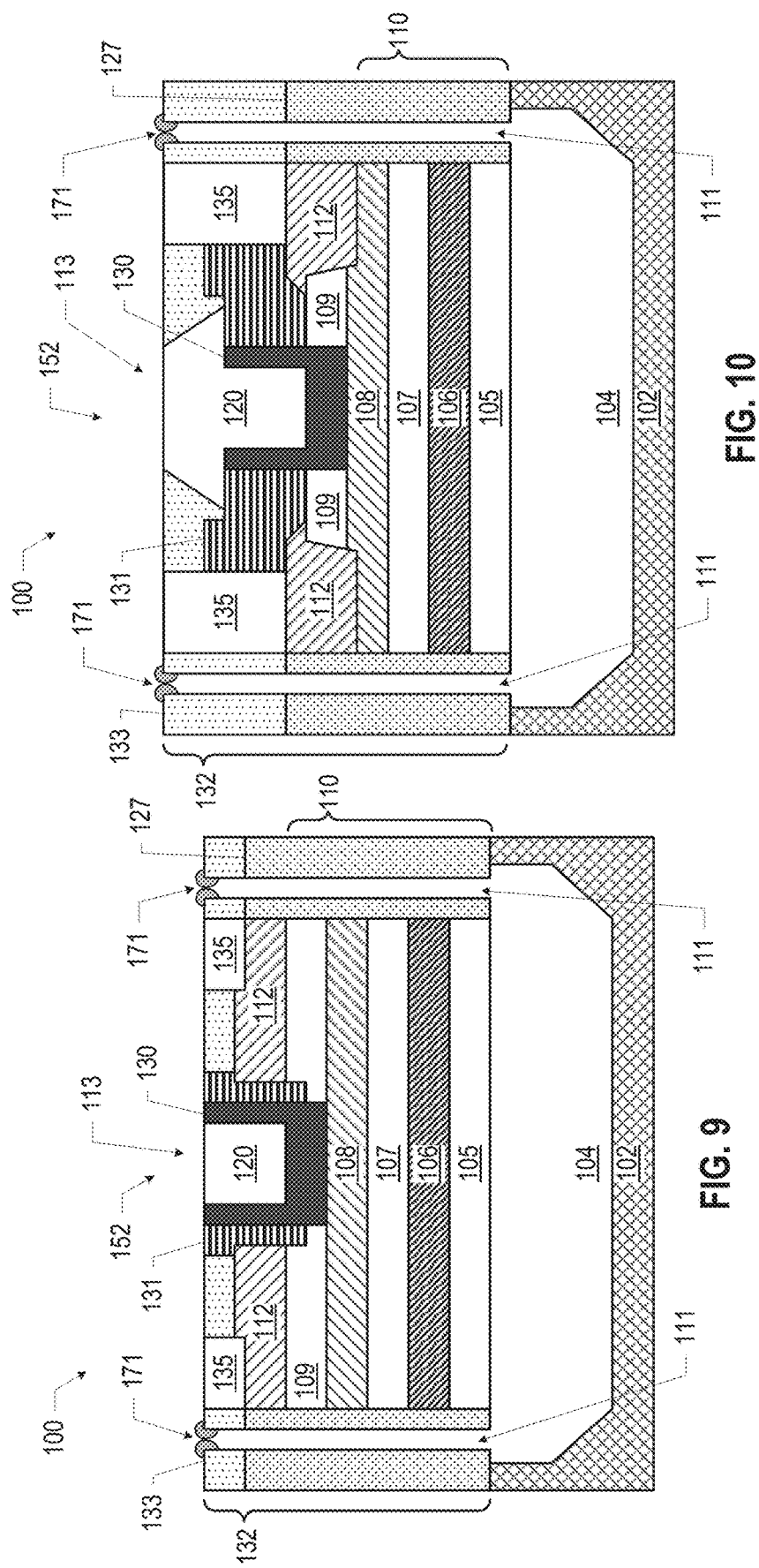

INTEGRATED CIRCUIT COMPONENTS WITH SUBSTRATE CAVITIES

CROSS-REFERENCE TO RELATED APPLICATION

This application is a national stage application under 35 U.S.C. § 371 of PCT International Application Serial No. PCT/US2017/046009, filed on Aug. 9, 2017 and entitled "INTEGRATED CIRCUIT COMPONENTS WITH SUBSTRATE CAVITIES," which is hereby incorporated by reference herein in its entirety.

BACKGROUND

Many dies and other integrated circuit (IC) components are built on a solid semiconductor substrate, Examples of materials that may be included in a solid semiconductor substrate include silicon, germanium, and group III-V materials.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 1-6 are side cross-sectional views of portions of example integrated circuit (IC) components with a substrate cavity, in accordance with various embodiments.

FIGS. 8-10 are side cross-sectional views of example IC components with a substrate cavity under a transistor, in accordance with various embodiments.

DETAILED DESCRIPTION

Figure 1:
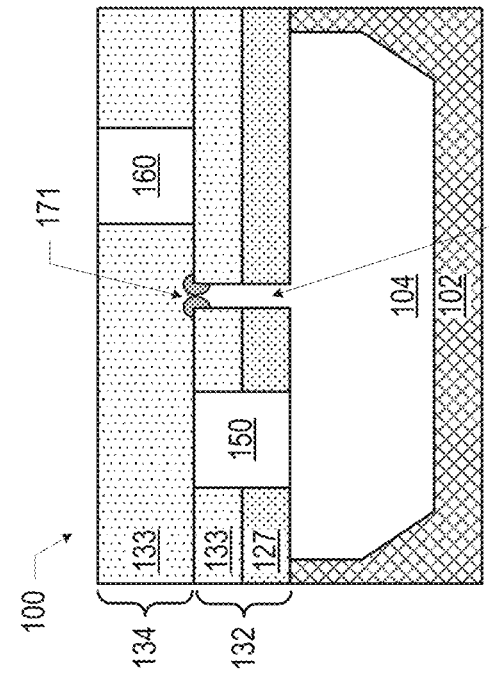

Disclosed herein are integrated circuit (IC) components with substrate cavities, as well as related techniques and assemblies. In some embodiments, an IC component may include a substrate, a device layer on the substrate, a plurality of interconnect layers on the device layer, and a cavity in the substrate.

As noted above, many dies and other IC components are built on a solid semiconductor substrate. The semiconductor substrate may provide a pathway through which leakage current flows, compromising the performance of transistors and other devices built on the substrate. Additionally, the semiconductor substrate itself may act as one plate of a capacitor (with other conductive elements in the IC component, such as source/drain (S/D) regions of a transistor, acting as another plate), and thus may induce undesirable parasitic capacitive coupling that may introduce undesirable cross-talk between different transistors and distort the electrical signals transmitted through the IC component.

Disclosed herein are IC components that include one or more substrate cavities. These substrate cavities may provide air gaps in the substrate itself, and may improve performance relative to conventional solid substrates. Substrate cavities may reduce leakage current by removing leakage pathways, and may reduce parasitic capacitance by increasing the distance between the material of the substrate and the other conductive elements of the IC component. IC components including the substrate cavities disclosed herein may exhibit a number of performance improvements, including increased transistor gain and thus greater efficiency (due to reduced leakage), increased operational frequency range (e.g., from 2 gigahertz, suitable for 3G/4G communications, to 5 gigahertz, suitable for 5G communications), and/or improved linearity and thus a greater data rate (e.g., from 4-quadrature amplitude modulation (QAM) to 16-QAM).

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration and actual devices made using these techniques will exhibit rounded corners, surface roughness, and other features. As used herein, two locations are "fluidly coupled" or in "fluid communication" if there is a channel between them for a fluid (e.g., a liquid or gas, such as air) to flow.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 7" may be used to refer to the collection of drawings of FIGS. 7A-7G, and the phrase "FIG. 11" may be used to refer to the collection of drawings of FIGS. 11A-11B.

FIGS. 1-6 are side cross-sectional views of portions of example IC components 100 with a substrate cavity 104, in accordance with various embodiments. Although FIGS. 1-6 depict a single substrate cavity 104 in the IC components 100, this is simply for ease of illustration, and any IC component 100 may include one or more substrate cavities 104.

The IC component 100 of FIG. 1 (and FIGS. 2-6) may include a substrate 102, a device layer 132, and an interconnect layer 134. The device layer 132 may be disposed on the substrate 102, and the interconnect layer 134 may be disposed on the device layer 132. Although FIGS. 1-6 depict a single interconnect layer 134 adjacent to the device layer 132, the IC component 100 may include multiple interconnect layers 134, and the back-end elements 160 disclosed herein may be included in any of the interconnect layers 134. In some embodiments, the IC component 100 may be part of a die (e.g., as discussed below with reference to FIG. 14). In some embodiments, an IC component 100 may not include a device layer 132 (e.g., when the IC component 100 is an interposer, as discussed below with reference to FIG. 16). A number of the elements of FIG. 1 discussed below are also included in other FIGS. (e.g., FIGS. 2-6), but the discussion of these elements is not repeated for ease of illustration. Any of the embodiments of any of these elements disclosed herein may be used in combination with any other elements disclosed herein, as appropriate.

In some embodiments, the IC component 100 may be a radio frequency (RE) component, in that electrical signals in the RF range of 3 kilohertz to 300 gigahertz propagate in the IC component 100. For example, the IC component 100 may include transistors 152 that operate in the RF range (referred to herein as "RF transistors"). The performance of RF components may be heavily compromised by parasitic capacitive coupling, and thus may substantially benefit from the substrate cavity arrangements disclosed herein.

In some embodiments, the substrate 102 may be a semiconductor substrate composed of semiconductor material systems including, for example, n-type or p-type materials systems (or a combination of both). In some embodiments, the substrate 102 may be a crystalline silicon substrate. In some embodiments, the substrate 102 may be a crystalline germanium substrate. In some embodiments, the substrate 102 may include a group III-V material. In some embodiments, the substrate 102 may have a silicon-on-insulator (SOI) substructure. In some embodiments, the substrate 102 may include silicon, germanium, indium antimonide, lead telluride, indium arsenide, indium phosphide, gallium arsenide, gallium antimonide, silicon carbide, and/or sapphire. Further materials classified as group II-VI, or IV may also be used in the substrate 102. Although a few examples of materials from which the substrate 102 may be formed are described here, any material that may serve as a foundation for an IC component 100 may be used. The substrate 102 may be part of a singulated die (e.g., the dies 1502 of FIG. 14, discussed below) or a wafer (e.g., the wafer 1500 of FIG. 14, discussed below).

One or more front-end elements 150 may be included in the device layer 132. Examples of front-end elements 150 may include transistors (e.g., the transistors 152 discussed below), passive components (e.g., inductors, resistors, or capacitors), or any other components formed in the device layer 132. The device layer 132 may include a dielectric material disposed around the front-end elements 150, as shown in FIG. 1. In the embodiment illustrated in FIG. 1, the device layer 132 may include a shallow trench isolation (STI) material 127 and an interlayer dielectric (ILD) 133. In some embodiments, the ILD 133 may include silicon oxide. The STI material 127 may be, for example, an oxide.

One or more back-end elements 160 may be included in the interconnect layer 134. Examples of back-end elements 160 may include interconnect structures (e.g., the lines 1628a and/or the vias 1628b discussed below with reference to FIG. 15), passive components (e.g., inductors, resistors, or capacitors), transistors (e.g., the transistors 152 discussed below), or any other components formed in the interconnect layer 134. The interconnect layer 134 may include an ILD 133 disposed around the back-end elements 160, as shown in FIG. 1. Additional layers of insulating material may be included in the interconnect layers 134, as desired. For example, an etch stop layer (not shown) may be included under any of the layers of ILD 133 disclosed herein.

Electrical signals, such as power and/or input/output (I/O) signals, may be routed to and/or from the devices of the device layer 132 through one or more interconnect layers 134 disposed on the device layer 132. As noted above, FIG. 1 depicts a single interconnect layer 134 for ease of illustration. In some embodiments, front-end elements 150 of the device layer 132 may be electrically coupled with interconnect structures (discussed below with reference to FIG. 15) or other elements in the interconnect layers 134. The one or more interconnect layers 134 may be part of a metallization stack (also referred to as an "ILD stack"), as discussed below with reference to FIG. 15.

The substrate cavity 104 may be filled with a gas, such as air. In some embodiments, the substrate cavity 104 may be under vacuum. In the embodiment of FIG. 1, the substrate cavity 104 may extend under the front-end element 150 and the back-end element 160. In other embodiments, the substrate cavity 104 may extend under the front-end element 150 but not the back-end element 160, or under the back-end element 160 but not under the front-end element 150. In some embodiments, the IC component 100 of FIG. 1 may include multiple substrate cavities 104 (e.g., one under the front-end element 150, and another under the back-end element 160).

In some embodiments, an inlet 111 may be in fluid communication with the substrate cavity 104. In the embodiment of FIG. 1, a single inlet 111 may extend from the substrate cavity 104 and may terminate at the interface between the STI material 127 and the ILD 133 of the device layer 132. In some embodiments, a substrate cavity 104 may be formed by etching out some of material of the substrate 102 through one or more ports 111 subsequent to forming the device layer 132 and/or one or more interconnect layers 134, as discussed in further detail below with reference to FIG. 7.

In some embodiments, the inlet 111 may be terminated with a seal material 171 (e.g., after the inlet 111 is used to remove some of the substrate 102, as discussed below with reference to FIG. 7). In some embodiments, the seal material 171 may hermetically seal the substrate cavity 104. The seal material 171 may have any suitable composition. For example, in some embodiments, the seal material 171 may include silicon, oxygen (e.g., in the form of silicon oxide), and/or nitrogen (e.g., in the form of silicon nitride). In some embodiments, the inlet 111 may not be terminated with a seal material 171; instead, the ILD 133 may terminate the inlet 111.

The substrate cavities 104 and ports 111 disclosed herein may have any suitable dimensions. In some embodiments, an inlet 111 may have a width 165 between 25 nanometers and 5 microns (e.g., between 50 nanometers and 1 micron). In some embodiments, the substrate cavity 104 may have a depth 164 between 50 nanometers and 5 microns. In some embodiments, a substrate cavity 104 may have a width 166 between 100 nanometers and 10 microns. In some embodiments, the width 166 may be greater than the depth 164 by a factor between 1.5 and 2.5 (e.g., between 1.75 and 2.25).

Figure 2:
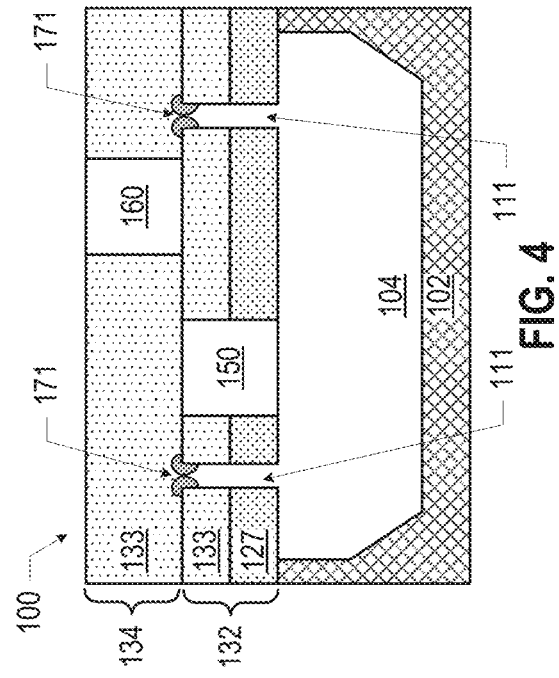
Figure 3:
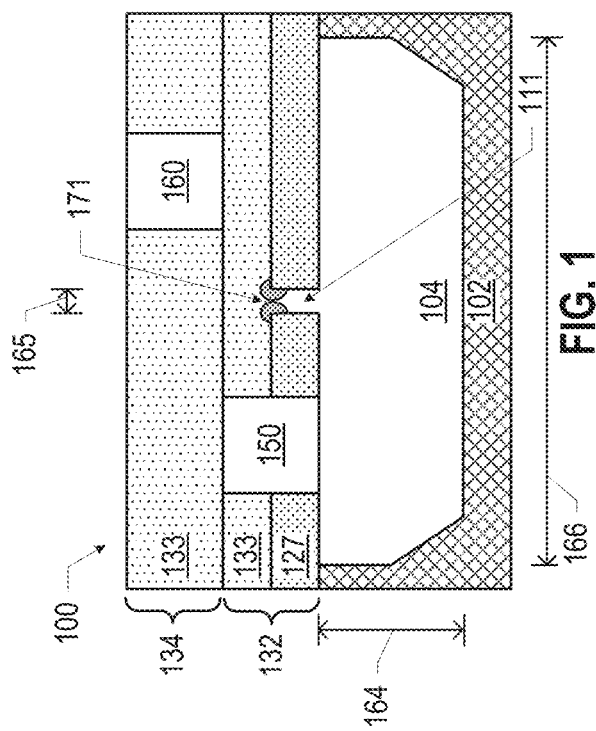

An inlet 111 may terminate in the device layer 132 (e.g., as shown in FIG. 1) or anywhere else in the IC component 100. For example, FIG. 2 illustrates an IC component 100 in which the inlet 111 terminates at the interface between the device layer 132 and the interconnect layer 134. In another example, FIG. 3 illustrates an IC component 100 in which the inlet 111 extends through the interconnect layer 134 and terminates at the top surface of the interconnect layer 134. Any of the ports 111 disclosed herein may terminate at any suitable location in the IC component 100.

Figure 4:
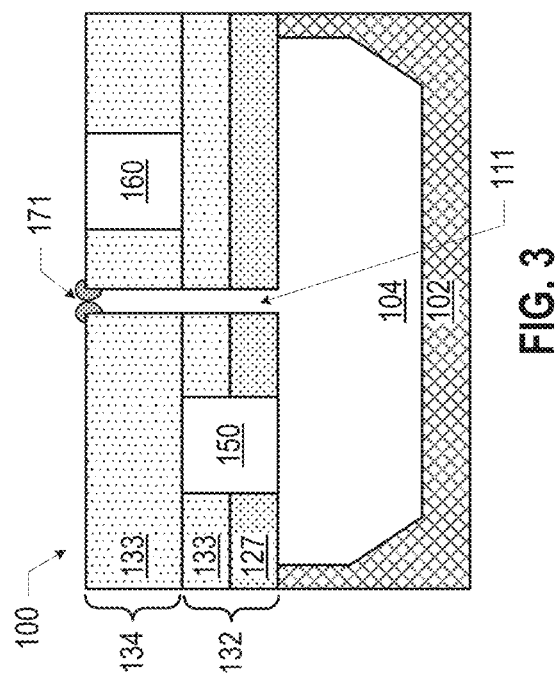

A substrate cavity 104 may be in fluid communication with one or more ports 111. For example, FIG. 4 illustrates an IC component 100 in which two ports 111 are in fluid communication with the substrate cavity 104. In the embodiment of FIG. 4, the two ports 111 are disposed at opposite sides of the front-end element 150.

The particular arrangements of ports 111, front-end elements 150, and back-end elements 160 depicted in FIGS. 1-4 are simply illustrative, and any arrangement may be used. For example, FIG. 5 illustrates an IC component 100 having two front-end elements 150 (e.g., two transistors 152, or arrays of transistors 152) under which a single substrate cavity 104 extends. In FIG. 5, three ports 111 may be arranged around the two front-end elements 150 and may terminate at the interface between the device layer 132 and the interconnect layer 134, as shown. In another example, FIG. 6 illustrates an IC component 100 having two back-end elements 160 (e.g., two lines) under which a single substrate cavity 104 extends. In FIG. 6, two ports 111 may be arranged so as to bookend the two back-end elements 160 and may terminate at the top surface of the interconnect layer 134, as shown.

Any suitable technique may be used to manufacture the IC components 100 and substrate cavities 104 disclosed herein. For example, FIGS. 7A-7G illustrate stages in an example process of manufacturing an IC component 100 with a substrate cavity 104, in accordance with various embodiments. In particular, FIGS. 7A-7G illustrate an example process for manufacturing the IC component 100 of FIG. 2, but modifications to this process may be made to manufacture any of the IC components 100 disclosed herein.

Figure 7A:
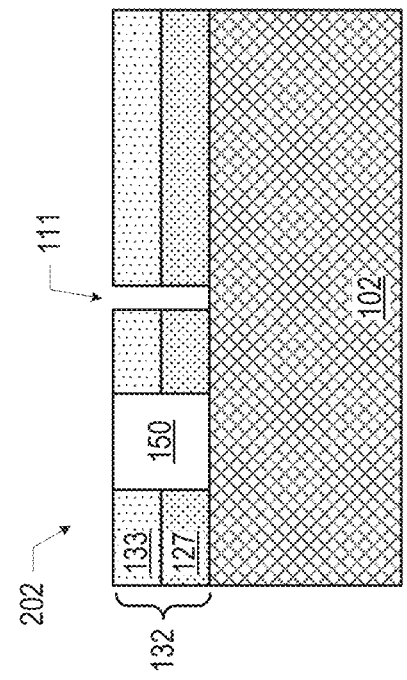
FIGS. 7A-7G illustrate stages in an example process of manufacturing an IC component with a substrate cavity, in accordance with various embodiments.

FIG. 7A is a side cross-sectional view of an assembly 200 including a substrate 102 and the device layer 132 on the substrate 102. The device layer 132 may include an STI material 127, an ILD 133, and a front-end element 150 (e.g., a transistor 152). The assembly 200 may be formed in accordance with any suitable fabrication techniques.

Figure 7B:
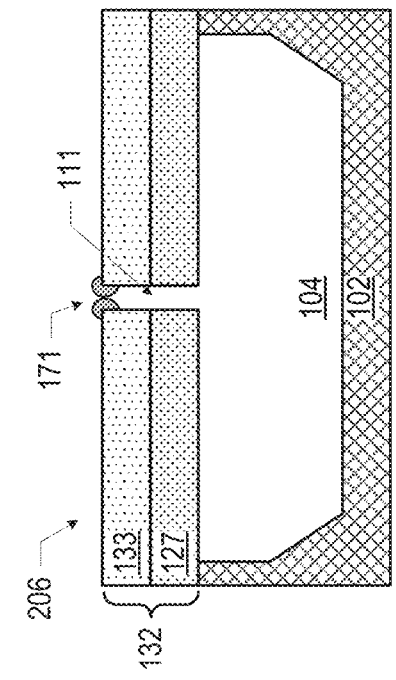

FIG. 7B is a side cross-sectional view of an assembly 202 subsequent to forming an inlet 111 in the assembly 200 (FIG. 7A). The inlet 111 may extend through the device layer 132, and may reach the top surface of the substrate 102. In some embodiments, the inlet 111 may be formed using a photolithography process in which the assembly 200 is masked, the mask is patterned to expose the portion of the assembly 200 that will be etched to form the inlet 111 (or ports 111), and an anisotropic etch may be performed to form the inlet 111. In embodiments of the IC component 100 in which the inlet 111 terminates within the device layer 132 (e.g., as discussed above with reference to FIG. 1), only a portion of the device layer 132 may be formed before forming the inlet 111. For example, a layer of STI material 127 may be deposited, the inlet 111 may be formed (and the operations discussed below with reference to FIGS. 7C-7D may be performed), and then the device layer 132 may be completed. In embodiments of the IC component 100 in which the inlet 111 terminates above the device layer 132 (e.g., as discussed above with reference to FIGS. 3 and 6), the device layer 132 and one or more interconnect layers 134 may be formed, and then the inlet 111 may be formed through the interconnect layer(s) 134 and the device layer 132.

Figure 7C:
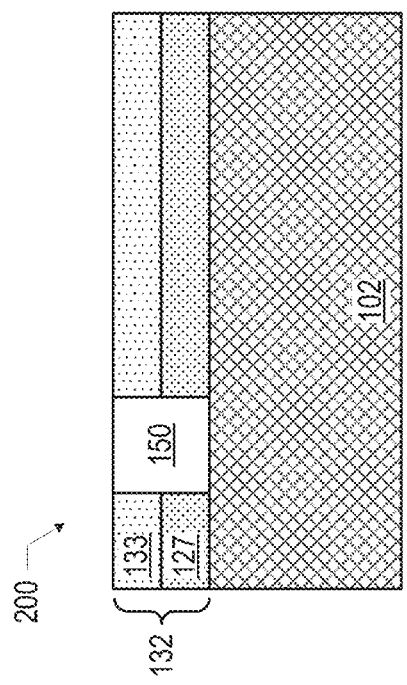

FIG. 7C is a side cross-sectional view of an assembly 204 subsequent to removing some of the material of the substrate 102 of the assembly 202 (FIG. 7B) to form the substrate cavity 104. In some embodiments, the material of the substrate 102 may be removed by introducing an etchant through the inlet(s) 111. The etchant may be selective to the material of the substrate 102. For example, in some embodiments in which the substrate 102 is crystalline silicon, the etchant may include xenon fluoride. The etch may be allowed to proceed until a desired amount of the material of the substrate 102 has been etched away. In some embodiments, the etch of the substrate 102 may be an isotropic etch.

Figure 7D:
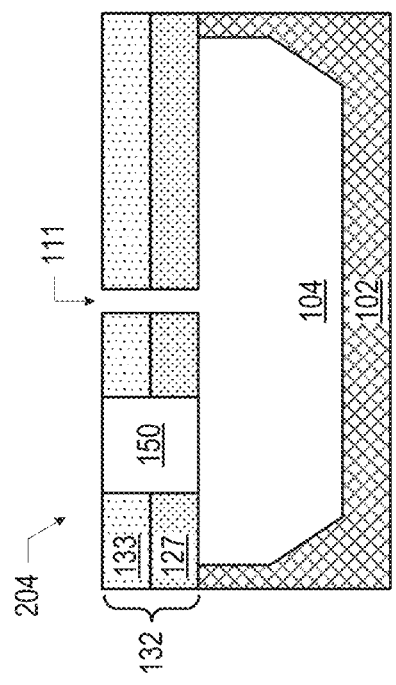
Figure 7E:
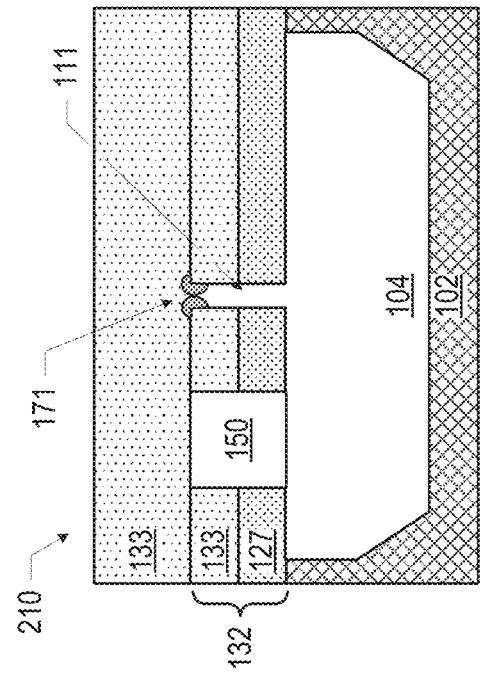
Figure 12:
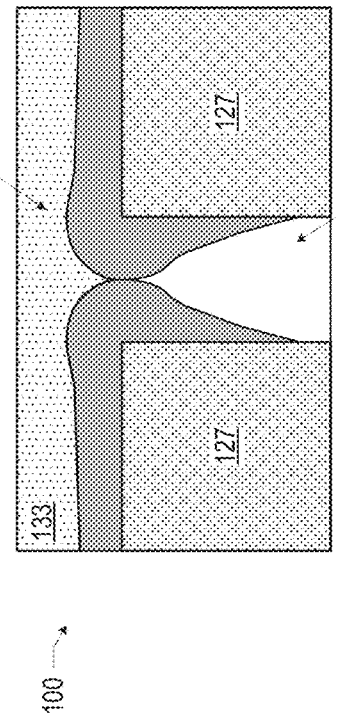
FIG. 12 is a side, cross-sectional, detail view of an example inlet termination in an IC component with a substrate cavity, in accordance with various embodiments.

FIG. 7D is a side cross-sectional view of an assembly 206 subsequent to providing a seal material 171 at the top of the inlet 111 of the assembly 204 (FIG. 7C) to hermetically seal the substrate cavity 104 and the inlet 111 from the surrounding environment. In some embodiments, the seal material 171 may be provided by physical vapor deposition (PVD) or chemical vapor deposition (CVD), as discussed further below with reference to FIG. 12, FIG. 7E is a side cross-sectional view of an assembly 208 subsequent to depositing an additional layer of ILD 133 on the assembly 206 (FIG. 7D). As shown in FIG. 7E, the top surface of the additional layer of ILD 133 may have a ripple or may be otherwise deformed by the presence of the seal material 171.

Figure 7F:
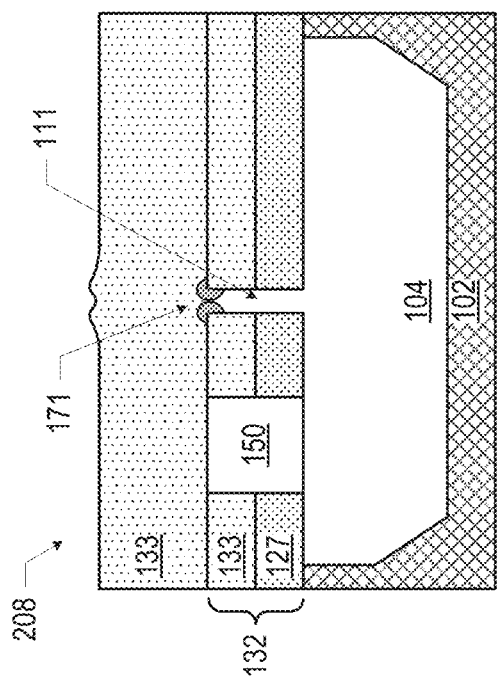

FIG. 7F is a side cross-sectional view of an assembly 210 subsequent to planarizing the additional layer of ILD 133 of the assembly 208 (FIG. 7E). In some embodiments, a chemical mechanical polishing (CMP) technique may be used to planarize the top surface of the additional layer of ILD 133.

Figure 7G:
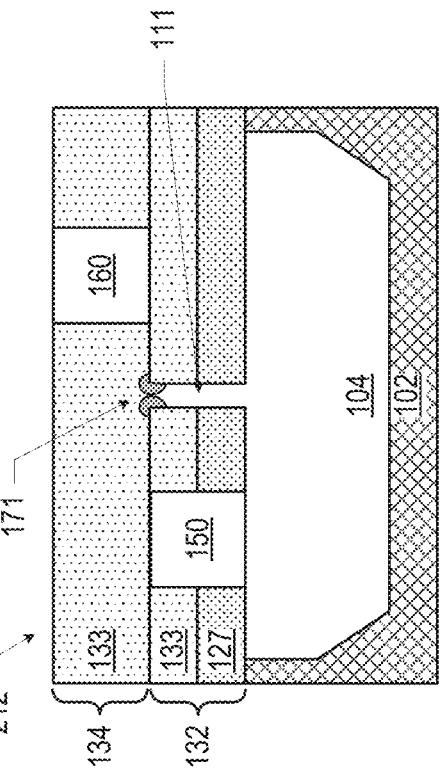

FIG. 7G is a side cross-sectional view of an assembly 212 subsequent to forming a back-end element 160 in the additional layer of ILD 133, The additional layer of ILD 133 and the back-end element 160 may provide the interconnect layer 134. The assembly 212 may take the form of the IC component 100 of FIG. 2.

As noted above, in some embodiments, the front-end element 150 and/or the back-end element 160 may include a transistor 152. FIGS. 8-10 illustrate various examples of transistors 152 that may be included in an IC component 100. In particular, FIGS. 8-10 are side cross-sectional views of example IC components 100 with a substrate cavity 104 under a transistor 152, in accordance with various embodiments. Although FIGS. 8-10 illustrate a single transistor 152 with a single substrate cavity 104 disposed underneath, this is simply for ease of illustration, and an IC component 100 may include multiple transistors 152 (e.g., arranged in an array of transistors, as discussed below with reference to FIG. 11), with one or more substrate cavities 104 disposed under one or more of the transistors 152. The transistors 152 of FIGS. 8-10 may be RF transistors, and thus may be suitable for use in RF ICs. The transistors 152 of FIGS. 8-10 may be planar or non-planar. For example, non-planar embodiments of the transistors 152 may have the stack 110 (discussed below) shaped into a fin around which the gate 113 (discussed below) wraps. The transistors 152 of FIGS. 8-10 may be field-effect transistor (FETs) having a junction between two materials with different band gaps as the channel, as discussed below, and thus may be referred to as high electron mobility transistors (HEMTs).

FIG. 8 is a side cross-sectional view of an IC component 100 including an example transistor 152. The transistor 152 of FIG. 8 may be a recessed-gate group III-nitride transistor. In some embodiments, a buffer layer 105 may be a bottom (first) layer of a group III-nitride semiconductor stack 110. The stack 110 may be grown on the substrate 102 prior to formation of the substrate cavity 104, or the stack 110 may be transferred to the substrate 102 prior to formation of the substrate cavity 104. In some embodiments, the buffer layer 105 may be a dielectric layer.

The stack 110 may include a bottom barrier layer 106, a channel layer 107, a charge-inducing layer 108, and a top barrier layer 109, In some embodiments, the channel layer 107 may be substantially monocrystalline. The channel layer 107 may include a crystalline arrangement of a first semiconductor material including one or more group III elements and nitrogen (referred to herein as a group III-nitride material). In some embodiments, the channel layer 107 may be an undoped group III-nitride material. In some embodiments, the channel layer 107 may be gallium nitride. In some embodiments, the channel layer 107 may be indium nitride. In some embodiments, the channel layer 107 may be a ternary alloy of gallium nitride, such as aluminum gallium nitride. In some embodiments, the channel layer 107 may be a ternary alloy of indium nitride, such as aluminum indium nitride. In some embodiments, the channel layer 107 may be a quaternary alloy including at least one group III element and nitrogen, such as indium aluminum gallium nitride. In some embodiments, the channel layer 107 may have a thickness between 5 nanometers and 20 nanometers.

The bottom barrier layer 106 and the top barrier layer 109 may include group III-nitride materials, which may be selected so that the bandgap of the barrier layers 106 and 109 is larger than the bandgap of the channel layer 107. In some embodiments, the barrier layers 106 and 109 may be substantially monocrystalline. In some embodiments, the barrier layers 106 and 109 may be lattice matched to the material of the channel layer 107. In some embodiments, the channel layer 107 may include gallium nitride, the bottom barrier layer 106 may include aluminum gallium nitride, and the top barrier layer 109 may include aluminum indium nitride. In some embodiments, the barrier layers 106 and 109 both include aluminum gallium nitride, or both include indium gallium nitride. In some embodiments, the barrier layers 106 and 109 both include quaternary alloys including at least one group III element and nitrogen, such as indium aluminum gallium nitride. In some embodiments, the barrier layers 106 and 109 may each include a multilayer stack of group III-nitrides. In some embodiments, the barrier layers 106 and 109 may each have a thickness between 1 nanometer and 5 nanometers. The thicknesses of the barrier layers 106 and 109 may not be equal.

The charge-inducing layer 108 may supply carriers to the channel layer 107. In some embodiments, the channel layer 107 may include gallium nitride, the barrier layers 106 and 109 may include aluminum indium nitride, and the charge-inducing layer 108 may include aluminum nitride. In some embodiments, the charge-inducing layer 108 may have a thickness between 1 nanometer and 4 nanometers. In some embodiments, the charge-inducing layer 108 may not be included in the transistor 152, and instead, the top barrier layer 109 may act as a source of sheet charge in the transistor 152.

The transistor 152 of FIG. 8 may include S/D regions 112. The S/D regions 112 may include any low bandgap group III-nitride material, such as indium gallium nitride, gallium nitride, or indium nitride, and may be doped (e.g., with an n-type impurity). In some embodiments, the source/drain (S/D) regions 112 may include crystalline indium gallium nitride, with an indium content between 0 percent and 30 percent.

The transistor 152 may include a gate 113. The gate 113 may include a gate electrode 120 and a gate dielectric 130. The gate electrode 120 may include a work function metal selected to achieve a desired threshold voltage. Examples of materials that may be included in the gate electrode 120 include tungsten, aluminum, titanium, tantalum, nickel, molybdenum, germanium, platinum, gold, ruthenium, palladium, iridium, and their alloys, silicides, carbides, nitrides, phosphides, and carbonitrides. In some embodiments, the width of the gate electrode 120 (e.g., along the fin) may be between 40 nanometers and 100 nanometers (e.g., approximately 50 nanometers).

The gate dielectric 130 may electrically insulate the gate electrode 120 from the stack 110, and may also isolate the gate electrode 120 from the S/D regions 112. The gate dielectric 130 may include hafnium, silicon, oxygen, titanium, tantalum, lanthanum, aluminum, zirconium, barium, strontium, yttrium, lead, scandium, niobium, zinc, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. At the interface between the gate electrode 120 and the top barrier layer 109, the gate dielectric 130 may act as a passivation layer. In some embodiments, the gate dielectric 130 may be deposited by atomic layer deposition (ALD).

The transistor 152 of FIG. 8 may be referred to as having a single recessed-gate architecture because the top barrier layer 109 includes a single recess (into which the gate dielectric 130 extends, as shown in FIG. 8). The top barrier layer 109 has a first thickness between the gate dielectric 130 and the channel layer 107 and a second thickness between the S/D regions 112 and the channel layer 107. In some embodiments, the first thickness may be less than 50 percent of the second thickness.

FIG. 9 is a side cross-sectional view of another transistor 152, sharing many elements of the transistor 152 of FIG. 8. Unlike the transistor 152 of FIG. 8, the transistor 152 of FIG. 9 may be referred to as having a double recessed-gate architecture because the top barrier layer 109 includes two recesses; one into which a spacer dielectric 131 extends and one into which the gate dielectric 130 extends. In some embodiments, the thickness of the top barrier layer 109 under the gate dielectric 130 may be zero (i.e., the gate dielectric 130 may contact the charge-inducing layer 108). The transistor 152 of FIG. 9 includes a spacer dielectric 131. In some embodiments, the spacer dielectric 131 may have a lower dielectric constant than the gate dielectric 130. The spacer dielectric 131 may include any of the materials discussed above with reference to the gate dielectric 130.

FIG. 10 is a side cross-sectional view of another transistors 152, also sharing many elements of the transistors 152 of FIGS. 8 and 9. The transistor 152 of FIG. 10 may also be a recessed-gate group III-nitride transistor. Unlike the transistors 152 of FIGS. 8 and 9, the transistor 152 of FIG. 10 has a T-shaped gate electrode 120 in which the upper portion of the gate electrode 120 has a wider lateral width than the lower portion of the gate electrode 120. The extra material of the gate electrode 120 provided by the upper portion of the T-shaped gate electrode 120 may result in reduced contact resistance for the gate 113. Additionally, the transistor 152 of FIG. 10 includes S/D regions 112 that extend down to the charge inducing layer 108, laterally contact the top barrier layer 109, and extend partially over the top barrier layer 109. In some embodiments, the distance between the upper portion of the T-shaped gate electrode 120 and the source/drain (S/D) contacts 135 may be 100 nanometers or greater (e.g., 150 nanometers or greater).

Figure 11A:
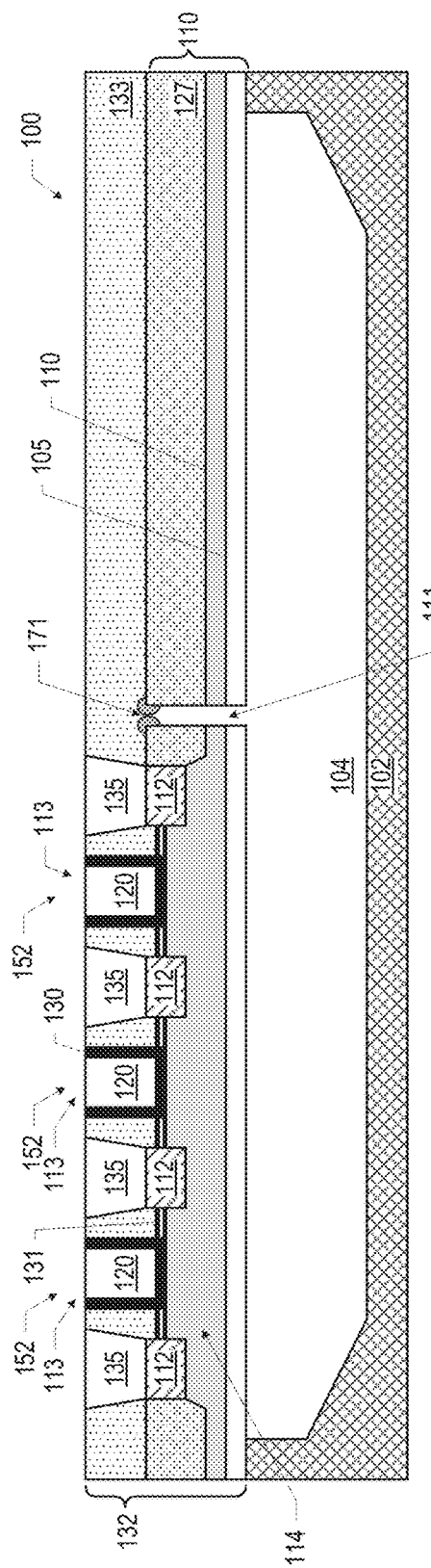
FIGS. 11A-11B are views of an example IC component with a substrate cavity under an array of transistors, in accordance with various embodiments.
Figure 11B:
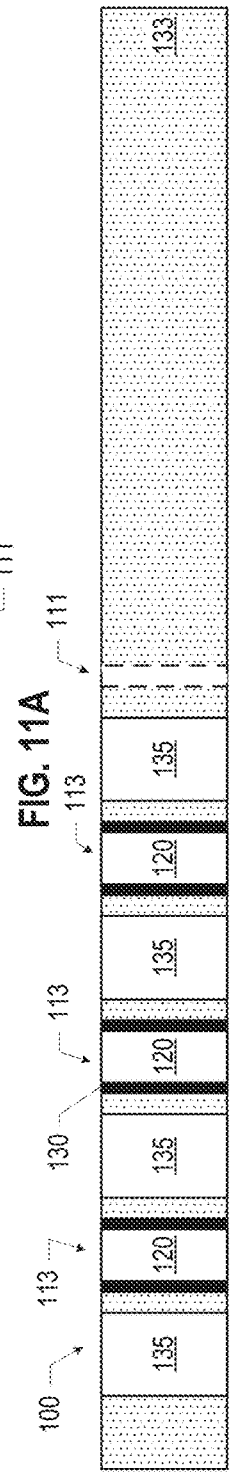

As noted above, in some embodiments, the substrate cavity 104 may extend under an array of transistors 152. FIGS. 11A-11B are views of an example IC component 100 with a substrate cavity 104 under an array of transistors 152, in accordance with various embodiments. In particular, FIG. 11A is a cross-sectional side view, and FIG. 11B is a top view. In FIG. 11B, the inlet 111 is shown in dashed lines to indicate its presence under the ILD 133. The array of transistors 152 illustrated in FIG. 11 includes three transistors 152, with three corresponding gates 113 disposed on a fin portion 114 of the stack 110. The elements of the transistors 152 illustrated in FIG. 11 may take the form of any of these elements discussed above with reference to FIGS. 8-10, for example. In the example of FIG. 11, a single inlet 111 terminates at the interface between the STI material 127 and the ILD 133 of the device layer 132, but the IC component 100 of FIG. 11 may include more than one inlet 111, and these ports 111 may be terminated at any appropriate location.

As noted above, in some embodiments, a seal material 171 may be used to hermetically seal an inlet 111 to fluidly isolate the substrate cavity 104. FIG. 12 is a side, cross-sectional, detail view of an example inlet termination in an IC component 100 with a substrate cavity 104, in accordance with various embodiments. In particular, FIG. 12 is a detailed view of an example embodiment of the seal material 171 in the IC component 100 of FIG. 1. As shown in FIG. 12, the seal material 171 may be deposited on the STI material 127 (e.g., by CVD or PVD) so as to cause the seal material 171 on the top interior walls of the inlet 111 to "neck" or "breadloaf" together and seal the inlet 111. Subsequent processing may then be performed (e.g., as discussed above with reference to FIGS. 7E-7F), Some embodiments of the IC components 100 disclosed herein may not include a seal material 171 that provides a necked seal; instead, a layer of insulating material (e.g., the ILD 133) may be laminated or otherwise deposited on the inlet 111, terminating the inlet 111.

Figure 13:
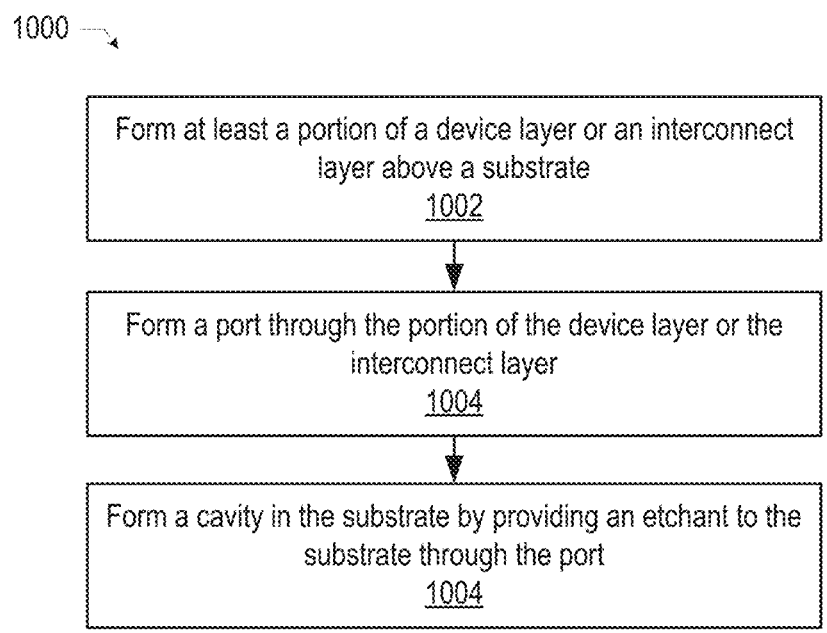
FIG. 13 is a flow diagram of a method of manufacturing an IC component including a substrate cavity, in accordance with various embodiments.

FIG. 13 is a flow diagram of a method 1000 of manufacturing an IC component including a substrate cavity, in accordance with various embodiments. Although the operations of the method 1000 may be illustrated with reference to particular embodiments of the IC components 100 and the substrate cavities 104 disclosed herein, the method 1000 may be used to form any suitable substrate cavities (e.g., in accordance with any of the embodiments of FIGS. 1-12). Operations are illustrated once each and in a particular order in FIG. 13, but the operations may be reordered and/or repeated as desired (e.g., with different operations performed in parallel when manufacturing multiple IC components simultaneously).

At 1002, at least a portion of a device layer or an interconnect layer may be formed above a substrate. For example, as illustrated in FIG. 7A, a device layer 132 may be formed above a substrate 102.

At 1004, an inlet may be formed through the portion of the device layer or the interconnect layer. For example, as illustrated in FIG. 7B, one or more ports 111 may be formed through the device layer 132.

At 1006, a cavity may be formed in the substrate by providing an etchant to the substrate through the inlet. For example, as illustrated in FIG. 7C, a substrate cavity 104 may be formed by providing an etchant to the substrate 102 through the inlet 111.

The substrate cavities 104 (and local structures) disclosed herein may be included in any suitable electronic component. FIG. 1448 illustrate various examples of apparatuses that may include any of the substrate cavities 104 disclosed herein. In particular, any of the apparatuses of FIGS. 14-18 may serve as and/or include any of the IC components 100 disclosed herein.

Figure 14:
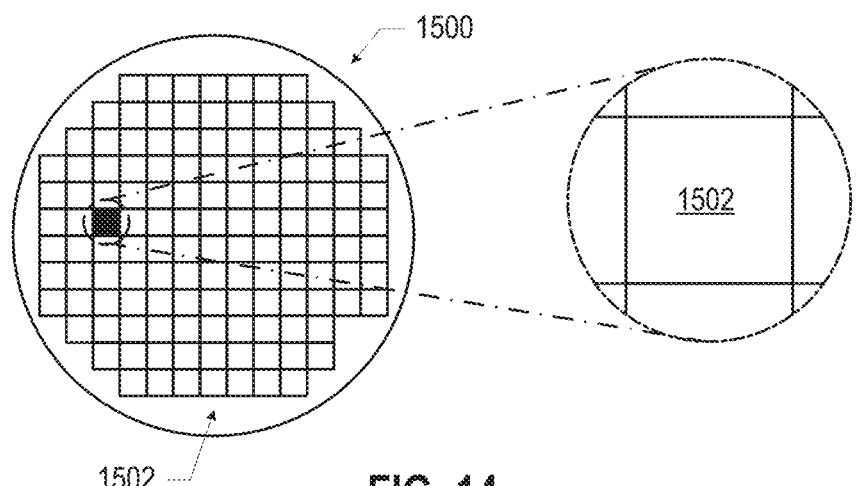
FIG. 14 is a top view of a wafer and dies that may include a substrate cavity, in accordance with any of the embodiments disclosed herein.
Figure 15:
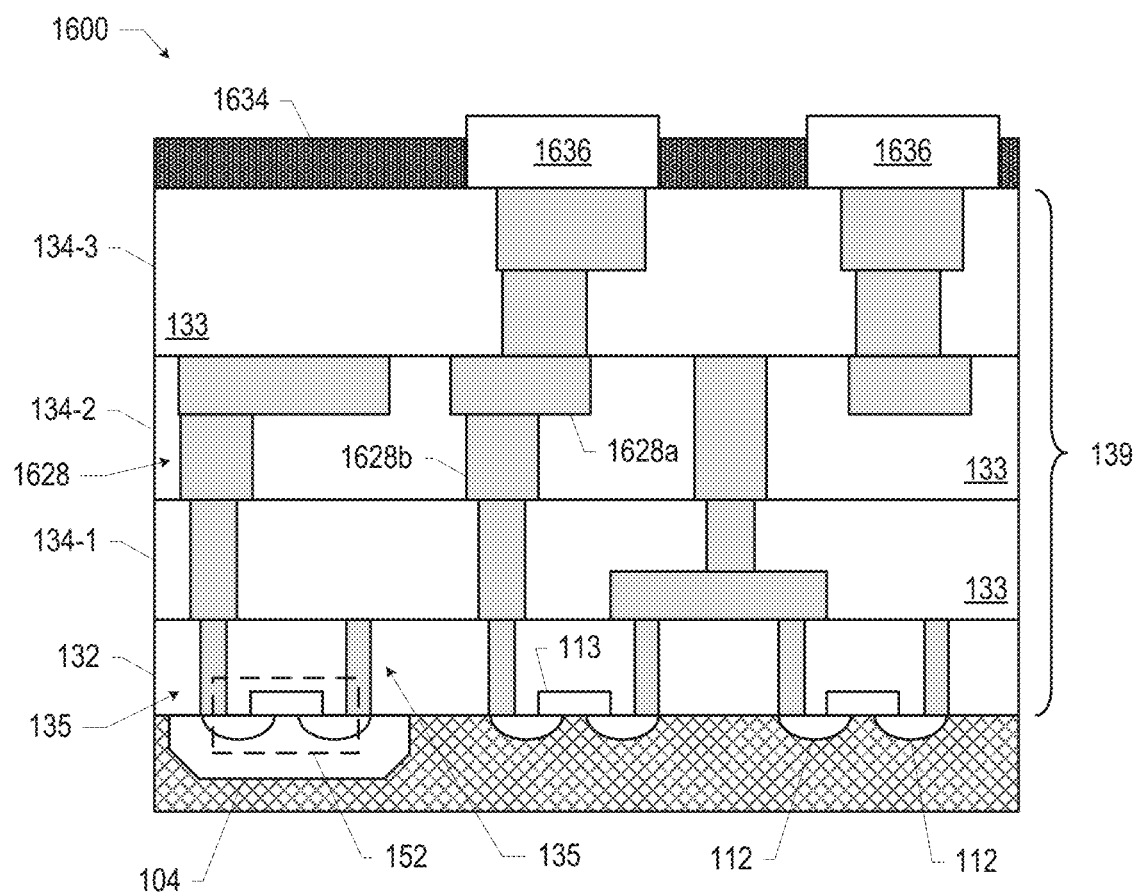
FIG. 15 is a cross-sectional side view of an IC device that may include a substrate cavity, in accordance with any of the embodiments disclosed herein.

FIG. 14 is a top view of a wafer 1500 and dies 1502 that may include one or more substrate cavities 104 (not shown), or may be included in an IC package whose substrate includes one or more substrate cavities 104 (e.g., as discussed below with reference to FIG. 16) in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more substrate cavities 104 (e.g., as discussed below with reference to FIG. 15), one or more transistors (e.g., any of the transistors 152 discussed herein) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 18) or other logic that is configured to store information in the memory devices or execute instructions stored in the memory array, FIG. 15 is a cross-sectional side view of an IC device 1600 that may include one or more substrate cavities 104, or may be included in an IC package whose substrate includes one or more substrate cavities 104 (e.g., as discussed below with reference to FIG. 16), in accordance with any of the embodiments disclosed herein. The IC device 1600 is thus an example embodiment of the IC components 100 disclosed herein. One or more of the IC devices 1600 may be included in one or more dies 1502 (FIG. 14). The IC device 1600 may be formed on a substrate 102 (e.g., the wafer 1500 of FIG. 14) and may be included in a die (e.g., the die 1502 of FIG. 14). The substrate 102 may take any of the forms discussed herein (e.g., as discussed above with reference to FIG. 1).

The IC device 1600 may include one or more device layers 132 disposed on the substrate 102. The device layers 132 may take any of the forms discussed herein (e.g., as discussed above with reference to FIG. 1). In some embodiments, the device layers 132 may include features of one or more transistors 152, in accordance with any of the embodiments disclosed herein, formed on the substrate 102. A number of examples of transistors 152 were discussed above, and additional examples of transistors 152 are now discussed.

As discussed above with reference to FIGS. 8-11, a transistor 152 in the device layer 132 of the IC device 1600 may include, for example, one or more S/D regions 112, a gate 113 to control current flow in the transistors 152 between the S/D regions 112, and one or more S/D contacts 135 to route electrical signals to/from the S/D regions 112. The transistors 152 may include additional features not depicted in FIG. 15 for the sake of clarity, such as device isolation regions, gate contacts, and the like; a number of these features are discussed above with reference to the transistors 152 of FIGS. 8-11. The transistors 152 are not limited to the type and configuration depicted in FIG. 15 and may include a wide variety of other types and configurations such as, for example, planar transistors, non-planar transistors, or a combination of both, Non-planar transistors may include FinFET transistors, such as double-gate transistors or tri-gate transistors, and wrap-around or all-around gate transistors, such as nanoribbon and nanowire transistors.

In some embodiments, a transistor 152 included in the IC device 1600 may include a gate 113 formed of at least two layers, a gate dielectric (e.g., the gate dielectric 130 of the transistors 152 of FIGS. 8-11) and a gate electrode (e.g., corresponding to the gate electrode 120 of the transistors 152 of FIGS. 8-11). The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric layer and may include at least one p-type work function metal or n-type work function metal, depending on whether the transistor 152 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 152 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 112 may be formed within the substrate 102 adjacent to the gate 113 of each transistor 152. The S/D regions 112 may be formed using an implantation/diffusion process or an etching/deposition process, for example. In the former process, dopants such as boron, aluminum, antimony, phosphorous, or arsenic may be ion-implanted into the substrate 102 to form the S/D regions 112. An annealing process that activates the dopants and causes them to diffuse farther into the substrate 102 may follow the ion-implantation process. In the latter process, the substrate 102 may first be etched to form recesses at the locations of the S/D regions 112. An epitaxial deposition process may then be carried out to fill the recesses with material that is used to fabricate the S/D regions 112. In some implementations, the S/D regions 112 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 112 may be formed using one or more alternate semiconductor materials such as germanium or a group III-V material or alloy. In further embodiments, one or more layers of metal and/or metal alloys may be used to form the S/D regions 112.

The interconnect layers 134 of the IC device 1600 may take the form of any of the interconnect layers 134 discussed herein. Electrical signals, such as power and/or input/output (I/O) signals, may be routed to and/or from the devices of the device layer 132 through one or more interconnect layers disposed on the device layer 132 (illustrated in FIG. 15 as interconnect layers 134-1, 134-2, and 134-3). For example, electrically conductive features of the device layer 132 (e.g., the gate 113 and the S/D contacts 135) may be electrically coupled with the interconnect structures 1628 of the interconnect layers 134. The one or more interconnect layers 134 may form a metallization stack (also referred to as an "ILD stack") 139 of the IC device 1600. In some embodiments, one or more transistors 152 or other passive or active devices, such as inductors or capacitors (not shown) may be disposed in one or more of the interconnect layers 134-1, in accordance with any of the techniques disclosed herein.

The interconnect structures 1628 may be arranged within the interconnect layers 134 to route electrical signals according to a wide variety of designs (in particular, the arrangement is not limited to the particular configuration of interconnect structures 1628 depicted in FIG. 15). Although a particular number of interconnect layers 134 is depicted in FIG. 15, embodiments of the present disclosure include IC devices having more or fewer interconnect layers than depicted.

In some embodiments, the interconnect structures 1628 may include lines 1628a and/or vias 1628b filled with an electrically conductive material such as a metal. Lines 1628a may be examples of the front-end element 160 (which, as discussed above, may include transmission lines, inductors, etc.). The lines 1628a may be arranged to route electrical signals in a direction of a plane that is substantially parallel with a surface of the substrate 102 upon which the device layer 132 is formed. For example, the lines 1628a may route electrical signals in a direction in and out of the page from the perspective of FIG. 15. The vias 1628b may be arranged to route electrical signals in a direction of a plane that is substantially perpendicular to the surface of the substrate 102 upon which the device layer 132 is formed. In some embodiments, the vias 1628b may electrically couple lines 1628a of different interconnect layers 134-1-134-3 together. Vias 1628b may be examples of the front-end element 160 (which, as discussed above, may include transmission lines, inductors, etc.).

As noted above, the interconnect layers 134 may include a ILD 133 disposed between the interconnect structures 1628, as shown in FIG. 15. In some embodiments, the ILD 133 disposed between the interconnect structures 1628 in different ones of the interconnect layers 134-1-134-3 may have different compositions; in other embodiments, the composition of the ILD 133 between different interconnect layers 134-1-134-3 may be the same.

A first interconnect layer 134-1 (referred to as Metal 1 or "M1") may be formed directly on the device layer 132. In some embodiments, the first interconnect layer 134-1 may include lines 1628a and/or vias 1628b, as shown. The lines 1628a of the first interconnect layer 134-1 may be coupled with contacts (e.g., the S/D contacts 135) of the device layer 132.

A second interconnect layer 134-2 (referred to as Metal 2 or "M2") may be formed directly on the first interconnect layer 134-1. In some embodiments, the second interconnect layer 134-2 may include vias 1628b to couple the lines 1628a of the second interconnect layer 134-2 with the lines 1628a of the first interconnect layer 134-1. Although the lines 1628a and the vias 1628b are structurally delineated with a line within each interconnect layer (e.g., within the second interconnect layer 134-2) for the sake of clarity, the lines 1628a and the vias 1628b may be structurally and/or materially contiguous (e.g., simultaneously filled during a dual-damascene process) in some embodiments.

A third interconnect layer 134-3 (referred to as Metal 3 or "M3") (and additional interconnect layers, as desired) may be formed in succession on the second interconnect layer 134-2 according to similar techniques and configurations described in connection with the second interconnect layer 134-2 or the first interconnect layer 134-1. In some embodiments, the interconnect layers that are "higher up" in the metallization stack 139 in the IC device 1600 (i.e., farther away from the device layer 132) may be thicker.

The IC device 1600 may include a solder resist material 1634 (e.g., polyimide or similar material) and one or more conductive contacts 1636 formed on the interconnect layers 134, In FIG. 15, the conductive contacts 1636 are illustrated as taking the form of bond pads. The conductive contacts 1636 may be electrically coupled with the interconnect structures 1628 and configured to route the electrical signals of the transistor(s) 152 (or other front-end elements 150 and/or back-end elements 160) to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 134; for example, the conductive contacts 1636 may include other analogous features (e.g., posts) that route the electrical signals to external components.

The substrate 102 of the IC device 1600 may include one or more substrate cavities 104, in accordance with any of the embodiments disclosed herein. A substrate cavity 104 included in the substrate 102 of the IC device 1600 of FIG. 15 may extend under one or more transistor 152 (in accordance with any of the embodiments disclosed herein), one or more lines 1628a, or one or more other elements included in the IC device 1600 (e.g., one or more inductors or other passive devices in the metallization stack 139, not shown in FIG. 15). Although a single substrate cavity 104 is depicted in FIG. 15, this is simply for ease of illustration, and any number and arrangement of substrate cavities 104 may be included in an IC device 1600.

Figure 16:
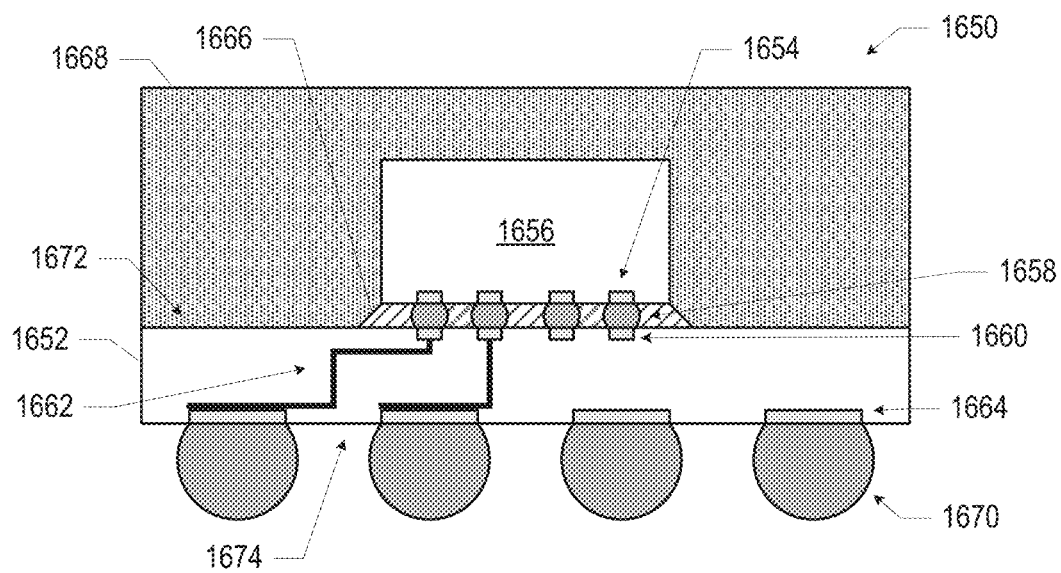
FIG. 16 is a cross-sectional side view of an IC package that may include a substrate cavity, in accordance with various embodiments.

FIG. 16 is a cross-sectional view of an example IC package 1650 that may include one or more substrate cavities 104. The package substrate 1652 may be formed of a dielectric material, and may have conductive pathways extending through the dielectric material between the face 1672 and the face 1674, between different locations on the face 1672, or between different locations on the face 1674. These conductive pathways may take the form of any of the interconnect structures 1628 discussed above with reference to FIG. 15, In some embodiments in which the package substrate 1652 includes a substrate 102 (e.g., in accordance with any of the embodiments discussed herein), the package substrate 1652 may include one or more substrate cavities 104 (not shown). In some embodiments, no substrate cavities 104 may be included in the package substrate 1652.

The IC package 1650 may include a die 1656 coupled to the package substrate 1652 via conductive contacts 1654 of the die 1656, first-level interconnects 1658, and conductive contacts 1660 of the package substrate 1652. The conductive contacts 1660 may be coupled to conductive pathways 1662 through the package substrate 1652, allowing circuitry within the die 1656 to electrically couple to various ones of the conductive contacts 1664 (or to other devices included in the package substrate 1652, such as passive or active devices, not shown). The first-level interconnects 1658 illustrated in FIG. 16 are solder bumps, but any suitable first-level interconnects 1658 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some embodiments, an underfill material 1666 may be disposed between the die 1656 and the package substrate 1652 around the first-level interconnects 1658, and a mold compound 1668 may be disposed around the die 1656 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 16 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 17.

Although the IC package 1650 illustrated in FIG. 16 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although a single die 1656 is illustrated in the IC package 1650 of FIG. 16, an IC package 1650 may include multiple dies 1656, An IC package 1650 may include additional passive components, such as surface-mount resistors, capacitors, and inductors disposed on the first face 1672 or the second face 1674 of the package substrate 1652, More generally, an IC package 1650 may include any other active or passive components known in the art.

Figure 17:
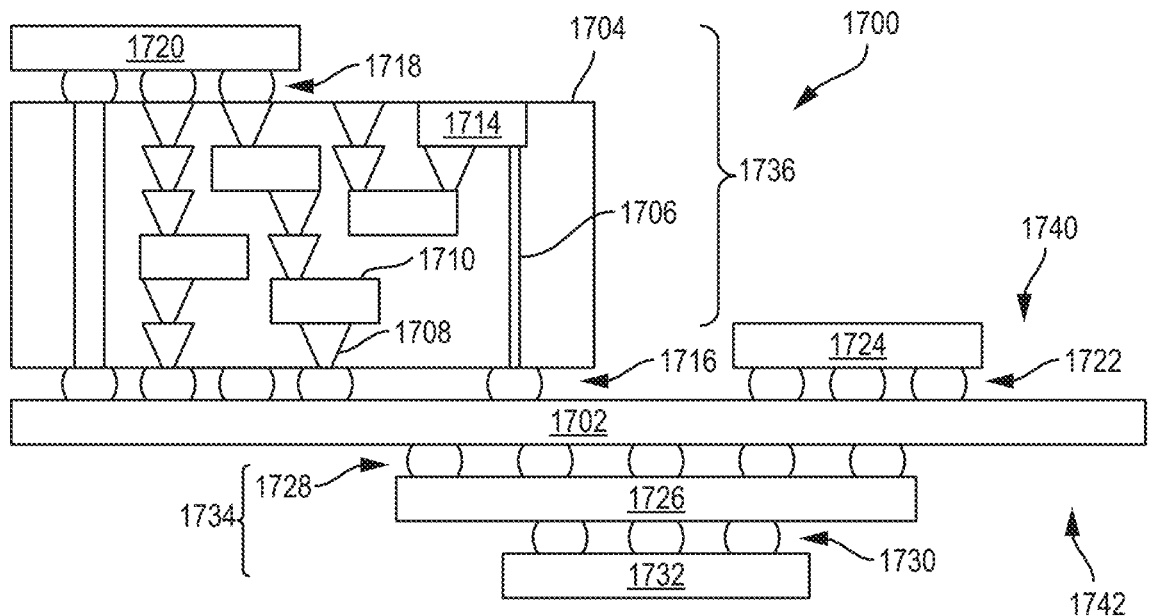
FIG. 17 is a cross-sectional side view of an IC device assembly that may include a substrate cavity, in accordance with any of the embodiments disclosed herein.

FIG. 17 is a cross-sectional side view of an IC device assembly 1700 that may include one or more IC packages or other electronic components (e.g., a die) including one or more substrate cavities 104, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 16 (e.g., may include one or more substrate cavities 104 in a package substrate 1652 or in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 17 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 17), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 17, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 14), an IC device (e.g., the IC device 1600 of FIG. 15), or any other suitable component. Generally, the interposer 1704 may spread a connection to a wider pitch or reroute a connection to a different connection. For example, the interposer 1704 may couple the IC package 1720 (e.g., a die) to a set of BGA conductive contacts of the coupling components 1716 for coupling to the circuit board 1702, In the embodiment illustrated in FIG. 17, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. Some such interposers 1704 may include one or more substrate cavities 104, in some embodiments. The interposer 1704 may include metal interconnects 1708 and vias 1710, including but not limited to through-silicon vias (TSVs) 1706, The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 17 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 18:
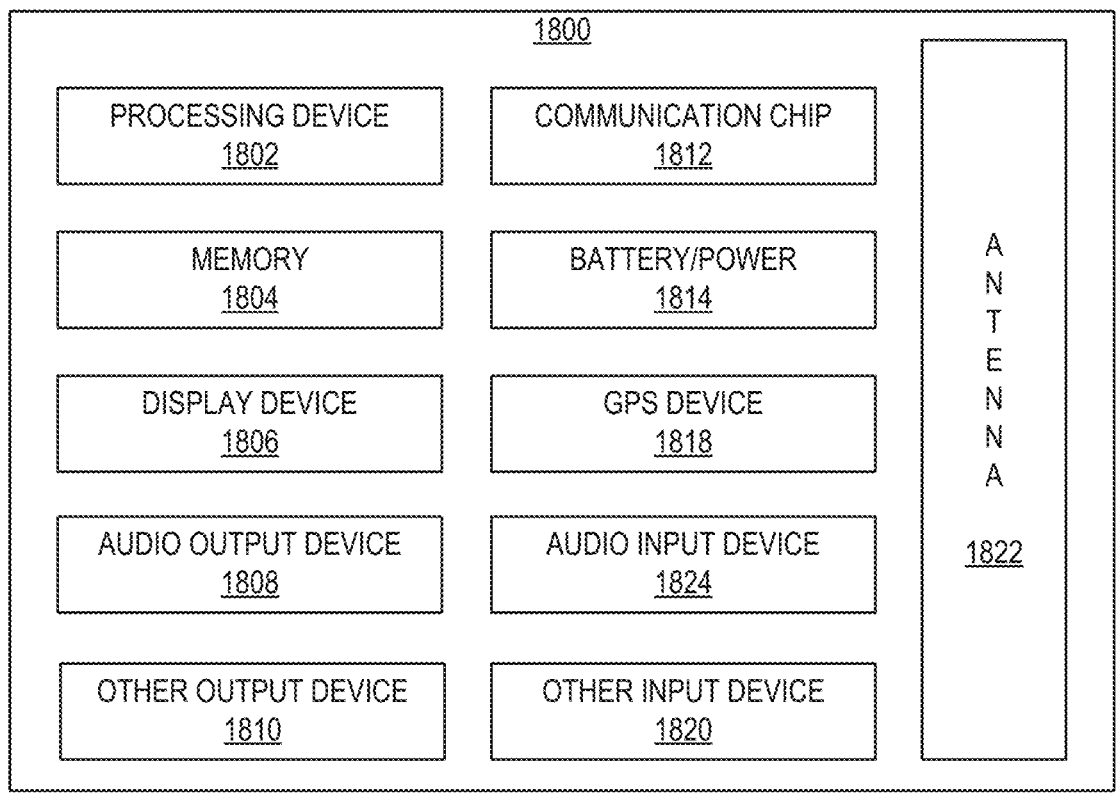
FIG. 18 is a block diagram of an example electrical device that may include a substrate cavity, in accordance with any of the embodiments disclosed herein.

FIG. 18 is a block diagram of an example electrical device 1800 that may include one or more substrate cavities 104, in accordance with any of the embodiments disclosed herein. For example, any suitable ones of the components of the electrical device 1800 may include one or more of the IC packages 1650, IC devices 1600, or dies 1502 disclosed herein, A number of components are illustrated in FIG. 18 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die. For example, the IC component 100 may be part of a RF device die (e.g., including any of the RF transistors 152 disclosed herein) included in an SoC.

Additionally, in various embodiments, the electrical device 1800 may not include one or more of the components illustrated in FIG. 18, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-M RAM).

In some embodiments, the electrical device 1800 may include a communication chip 1812 (e.g., one or more communication chips). For example, the communication chip 1812 may be configured for managing wireless communications for the transfer of data to and from the electrical device 1800, The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as) "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (OR) code reader, any sensor, or a radio frequency identification (RFID) reader.

The electrical device 1800 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide examples of various ones of the embodiments disclosed herein.

Example 1 is an integrated circuit (IC) component, including: a substrate; a device layer on the substrate; a plurality of interconnect layers on the device layer; and a cavity in the substrate.

Example 2 may include the subject matter of Example 1, and may further specify that the cavity is filled with a gas.

Example 3 may include the subject matter of Example 2, and may further specify that the gas includes air.

Example 4 may include the subject matter of any of Examples 1-3, and may further specify that the device layer includes a transistor, and the cavity is at least partially under the transistor.

Example 5 may include the subject matter of Example 4, and may further specify that the transistor is a radio frequency (RE) transistor.

Example 6 may include the subject matter of any of Examples 4-5, and may further specify that the transistor includes a group III-nitride high electron mobility transistor.

Example 7 may include the subject matter of any of Examples 4-6, and may further specify that the transistor includes a polarization layer.

Example 8 may include the subject matter of any of Examples 4-7, and may further specify that the transistor is included in an array of transistors on a fin, and the cavity is at least partially under the array of transistors.

Example 9 may include the subject matter of any of Examples 1-8, and may further specify that the plurality of interconnect layers includes a conductive line, and the cavity is at least partially under the conductive line.

Example 10 may include the subject matter of any of Examples 1-9, and may further specify that the plurality of interconnect layers includes an inductor, and the cavity is at least partially under the inductor.

Example 11 may include the subject matter of any of Examples 1-10, and may further include:

an inlet in fluid communication with the cavity.

Example 12 may include the subject matter of Example 11, and may further specify that the inlet terminates in the device layer.

Example 13 may include the subject matter of Example 11, and may further specify that the inlet terminates in an interconnect layer.

Example 14 may include the subject matter of Example 11, and may further specify that the inlet terminates at a boundary between the device layer and an adjacent interconnect layer.

Example 15 may include the subject matter of any of Examples 11-14, and may further specify that the inlet has a width between 50 nanometers and 1 micron.

Example 16 may include the subject matter of any of Examples 11-15, and may further specify that the inlet is one of a plurality of ports in fluid communication with the cavity.

Example 17 may include the subject matter of any of Examples 11-16, and may further specify that the inlet terminates with a necked seal.

Example 18 may include the subject matter of any of Examples 1-17, and may further specify that the cavity has a width between 50 nanometers and 3 microns.

Example 19 may include the subject matter of any of Examples 1-18, and may further specify that the cavity has a depth between 100 nanometers and 5 microns.

Example 20 may include the subject matter of any of Examples 1-19, and may further specify that the IC component is a die.

Example 21 may include the subject matter of Example 20, and may further specify that the die is part of a system-on-a-chip (SoC).

Example 22 may include the subject matter of any of Examples 1-21, and may further specify that the substrate includes a crystalline semiconductor.

Example 23 may include the subject matter of Example 22, and may further specify that the substrate includes crystalline silicon or crystalline germanium.

Example 24 is a method of manufacturing an integrated circuit (IC) component, including: forming at least a portion of a device layer or an interconnect layer above a substrate; forming an inlet through the portion of the device layer or the interconnect layer; and forming a cavity in the substrate by providing an etchant to the substrate through the inlet.

Example 25 may include the subject matter of Example 24, and may further specify that the portion of the device layer or the interconnect layer includes a layer of shallow trench isolation material proximate to a fin.

Example 26 may include the subject matter of any of Examples 24-25, and may further specify that the portion of the device layer or the interconnect layer includes an entire device layer.

Example 27 may include the subject matter of Example 26, and may further specify that the device layer or the interconnect layer is a device layer, and the method further includes: after forming the device layer, forming an interconnect layer on the device layer; wherein the inlet extends through the interconnect layer and the device layer.

Example 28 may include the subject matter of any of Examples 24-27, and may further specify that the etchant includes xenon fluoride.

Example 29 may include the subject matter of any of Examples 24-28, and may further specify that the substrate includes crystalline silicon.

Example 30 may include the subject matter of any of Examples 24-29, and may further include, after forming the inlet, sealing the cavity.

Example 31 is a computing device, including a die that includes: a substrate, a device layer on the substrate, a plurality of interconnect layers on the device layer, and a cavity in the substrate.

Example 32 may include the subject matter of Example 31, and may further specify that the die includes one or more radio frequency (RF) transistors.

Example 33 may include the subject matter of any of Examples 31-32, and may further specify that the die includes a transistor having a channel that includes a group III-nitride material.

Example 34 may include the subject matter of any of Examples 31-33, and may further specify that the die includes a passive component, and the cavity is at least partially under the passive component.

Example 35 may include the subject matter of any of Examples 31-34, and may further specify that the die includes a transistor having a T-shaped gate.

Example 36 may include the subject matter of any of Examples 31-35, and may further include a circuit board, wherein the die is electrically coupled to the circuit board.

Example 37 may include the subject matter of any of Examples 31-36, and may further include an antenna communicatively coupled to the die.

Example 38 is an integrated circuit (IC) component, including: a substrate; a plurality of interconnect layers above the substrate; and a cavity in the substrate.

Example 39 may include the subject matter of Example 38 wherein the cavity is filled with a gas.

Example 40 may include the subject matter of Example 39, and may further specify that the gas includes air.

Example 41 may include the subject matter of any of Examples 38-40, and may further specify that the plurality of interconnect layers includes a conductive line, and the cavity is at least partially under the conductive line.

Example 42 may include the subject matter of any of Examples 38-41, and may further specify that the plurality of interconnect layers includes an inductor, and the cavity is at least partially under the inductor.

Example 43 may include the subject matter of any of Examples 38-42, and may further specify that the IC component is an interposer.

Example 44 may include the subject matter of any of Examples 38-43, and may further include an inlet in fluid communication with the cavity.

Example 45 may include the subject matter of any of Examples 38-44, and may further specify that the substrate includes a crystalline semiconductor.

Example 46 may include the subject matter of Example 45, and may further specify that the substrate includes crystalline silicon or crystalline germanium.

The invention claimed is:

1. An integrated circuit (IC) component, comprising:
   a substrate;
   a device layer on the substrate;
   a plurality of interconnect layers on the device layer;
   a cavity in the substrate;
   an inlet in fluid communication with the cavity;
   a seal material sealing a top of the inlet; and
   a dielectric material formed over the seal material, the dielectric material different from the seal material.

2. The IC component of claim 1, wherein the cavity is filled with a gas.

3. The IC component of claim 1, wherein the device layer includes a transistor, and the cavity is at least partially under the transistor.

4. The IC component of claim 3, wherein the transistor is included in an array of transistors on a fin, and the cavity is at least partially under the array of transistors.

5. The IC component of claim 1, wherein the plurality of interconnect layers includes a conductive line, and the cavity is at least partially under the conductive line.

6. The IC component of claim 1, wherein the plurality of interconnect layers includes an inductor, and the cavity is at least partially under the inductor.

7. The IC component of claim 1, wherein the inlet terminates in the device layer.

8. The IC component of claim 1, wherein the inlet terminates in an interconnect layer.

9. The IC component of claim 1, wherein the inlet terminates at a boundary between the device layer and an adjacent interconnect layer.

10. The IC component of claim 1, wherein the inlet is one of a plurality of ports in fluid communication with the cavity.

11. The IC component of claim 1, wherein the IC component is a die.

12. The IC component of claim 1, wherein the substrate includes a crystalline semiconductor.

13. A computing device, comprising:
    a die including:
      a substrate,
      a device layer on the substrate,
      a plurality of interconnect layers on the device layer,
      a cavity in the substrate,
      an inlet in fluid communication with the cavity,
      a seal material sealing a top of the inlet, and
      a dielectric material formed over the seal material, the dielectric material different from the seal material.

14. The computing device of claim 13, wherein the die includes a transistor having a channel that includes a group III-nitride material.

15. The computing device of claim 13, wherein the die includes a passive component, and the cavity is at least partially under the passive component.

16. The computing device of claim 13, wherein the die includes a transistor having a T-shaped gate.

17. An integrated circuit (IC) component, comprising:
a substrate;
a plurality of interconnect layers above the substrate;
a cavity in the substrate;
an inlet in fluid communication with the cavity;
a seal material sealing a top of the inlet; and
a dielectric material formed over the seal material, the dielectric material different from the seal material.

18. The IC component of claim 17, wherein the substrate includes a crystalline semiconductor.

19. The IC component of claim 1, wherein the dielectric material has a deformation in an area over the seal material.

20. The IC component of claim 1, wherein the seal material hermetically seals the inlet.

21. The IC component of claim 1, wherein the seal material forms a necked seal at the top of the inlet.

22. The IC component of claim 1, wherein at least one of the plurality of interconnect layers is formed in the dielectric material.

* * * * *